(12) United States Patent
Cho et al.

(10) Patent No.: US 6,391,693 B1
(45) Date of Patent: May 21, 2002

(54) METHOD FOR MAKING POLYSILICON THIN FILM TRANSISTOR HAVING MULTIPLE GATE ELECTRODES

(75) Inventors: Dae Han Cho, Kwangju; Kyung Ha Lee, Seoul, both of (KR)

(73) Assignee: Hyundai Display Technology Inc., Kyoungki-do (KR)

( * ) Notice: Subject to any disclaimer, the term of this patent is extended or adjusted under 35 U.S.C. 154(b) by 0 days.

(21) Appl. No.: 09/652,187

(22) Filed: Aug. 31, 2000

Related U.S. Application Data

(62) Division of application No. 09/344,179, filed on Jun. 24, 1999, now Pat. No. 6,144,042.

(30) Foreign Application Priority Data

Jun. 25, 1998 (KR) .............................................. 98-24216

(51) Int. Cl.[7] .......................... H01L 21/00; H01L 21/84
(52) U.S. Cl. ...................................... 438/160; 438/157
(58) Field of Search ................................. 438/151, 158, 438/160, 157; 257/66, 365

(56) References Cited

U.S. PATENT DOCUMENTS

| | | | |
|---|---|---|---|
| 4,003,868 A | * 1/1977 | Smith et al. ................. 522/103 |
| 4,678,281 A | 7/1987 | Bauer |
| 4,945,067 A | * 7/1990 | Huang ......................... 438/157 |
| 5,010,027 A | * 4/1991 | Possin et al. ................ 438/159 |
| 5,057,889 A | 10/1991 | Yamada et al. |
| 5,066,106 A | 11/1991 | Sakamoto et al. |
| 5,191,453 A | 3/1993 | Okumura |
| 5,371,025 A | * 12/1994 | Sung ........................... 438/160 |
| 5,581,382 A | 12/1996 | Kim |
| 5,602,047 A | * 2/1997 | Tsai et al. ................... 438/160 |
| 5,771,083 A | 6/1998 | Fujihara et al. |
| 5,817,548 A | * 10/1998 | Noguchi et al. ............ 438/160 |
| 5,834,071 A | * 11/1998 | Lin ............................. 427/578 |
| 5,877,514 A | 3/1999 | Seo |
| 6,046,479 A | 4/2000 | Young et al. |

FOREIGN PATENT DOCUMENTS

| | | |
|---|---|---|
| JP | 553137 | 3/1993 |
| JP | 572995 | 3/1993 |

* cited by examiner

Primary Examiner—Olik Chaudhuri
Assistant Examiner—Marcos D. Pizarro-Crespo
(74) Attorney, Agent, or Firm—Selitto, Behr & Kim

(57) ABSTRACT

Disclosed is a polysilicon thin film transistor capable of reducing leakage current in the off state and method for manufacturing the same. The polysilicon thin film transistor comprises a substrate; at least two gate electrodes formed on the substrate; an insulating layer coated on the gate electrodes; a channel layer formed on the gate insulating layer to cover the entire gate electrodes and made of polysilicon; an ion stopper formed on the channel layer corresponding to the gate electrode; impurity regions formed on the channel layer at both sides of the ion stopper; and source and drain electrodes contacted with outermost regions among the impurity regions respectively, wherein the outermost impurity regions are source and drain regions and the region between the gate electrodes is an auxiliary junction region for compensating ON current.

9 Claims, 4 Drawing Sheets

METHOD FOR MAKING POLYSILICON THIN FILM TRANSISTOR HAVING MULTIPLE GATE ELECTRODES

This application is a divisional of U.S. patent appln. Ser. No. 09/344,179 filed Jun. 24, 1999, now U.S. Pat. No. 6,144,042, issued Nov. 7, 2000.

FIELD OF THE INVENTION

The present invention generally relates to a polysilicon thin film transistor and method for manufacturing the same, more particularly to a polysilicon thin film(hereinafter "POLY-TFT") capable of reducing leakage current and method for manufacturing the same.

BACKGROUND OF THE INVENTION

Thin film transistors are generally used for switching devices in the liquid crystal displays. Among the thin film transistors, the POLY-TFT has a relatively smaller size and faster operation speed, compared to the conventional amorphous silicon thin film transistors(a-Si-TFT).

When the POLY-TFT is applied to the liquid crystal display, it is possible to obtain thin and small modules. Further, a means for switching at an array substrate and a drive IC at a printed circuit board can be formed simultaneously thereby reducing manufacturing costs.

Herein, a top gate method in which a gate electrode is laid on an upper portion of a channel layer is frequently used in the conventional POLY-TFTs. However, the POLY-TFT according to the top gate method requires a number of masking processes.

Accordingly, there has been suggested a bottom gate method that requires less masking processes than the conventional top gate method.

As shown in FIG. 1, a buffer layer(not shown) is formed on a glass substrate 1 and a metal layer is deposited on the glass substrate 1. A metal layer is patterned in some portions thereof thereby forming a gate electrode 2. A gate insulating layer 3 is deposited on the entire glass substrate 1 in which the gate electrode 2 is formed. A polysilicon layer is deposited on the entire gate insulating layer 3 and patterned to cover the gate electrode 2 thereby forming a channel layer 4. An insulating layer is deposited on the channel layer 4 and the gate insulating layer 3. Thereafter, the insulating layer is patterned according to a back-exposing method thereby forming an ion stopper 6. A source region 5a and a drain region 5b are formed at both sides of the ion stopper 6 by implanting impurity ions into the channel layer 4.

Another metal layer is deposited on the resultant, and some portions of the metal layer is patterned to be contact with the source and drain regions 5a, 5b thereby forming a source electrode 7a and a drain electrode 7b.

The POLY-TFT according to the bottom gate method does not require any masking process for forming the ion stopper 6. Therefore, one masking step may be reduced, compared to the conventional top gate method requiring the masking step for producing the ion stopper 6.

However, a relatively high drain electric field is maintained even in the off-state, since a distance between the source region 5a and the drain region 5b of the POLY-TFT according to the bottom gate method is very small. Therefore, a large quantity of leakage current is generated in the off-state.

SUMMARY OF THE INVENTION

Accordingly, it is one object of the present invention to provide a POLY-TFT capable of preventing the leakage current in the off-state.

It is another object of the present invention to provide a method for manufacturing POLY-TFT capable of reducing the number of manufacturing steps.

To accomplish the objects of the present invention, in one aspect, the POLY-TFT comprises a substrate; at least two gate electrodes formed on the substrate; an insulating layer coated on the gate electrodes; a channel layer formed on the gate insulating layer to cover the entire gate electrodes and made of polysilicon; an ion stopper formed on the channel layer corresponding to the gate electrode; impurity regions formed on the channel layer at both sides of the ion stopper; and source and drain electrodes contacted with outermost regions among the impurity regions respectively, wherein the outermost impurity regions are source and drain regions and the region between the gate electrodes is an auxiliary junction region for compensating an ON current.

In another aspect, the present invention further provides a method for manufacturing the POLY-TFT comprising the steps of: forming a plurality of gate electrodes by depositing a metal layer on a substrate and by patterning the structure; forming a gate insulating layer on the plurality of gate electrodes and on the substrate; forming a channel layer by depositing an amorphous silicon layer to cover the plurality of gate electrodes and by patterning some portions thereof; forming an ion stopper on a selected position of the channel layer corresponding to the gate electrode according to a back-exposing method; implanting impurities into both sides of the ion stopper; changing the amorphous channel layer to be a polysilicon layer by activating the implanted impurities; and forming a source electrode and a drain electrode by depositing a metal layer on the resultant and by patterning the metal layer in some portions thereof.

According to the present invention, since at least two gate electrodes are formed in the POLY-TFT, the channel length is increased. Therefore, the drain electric field is decreased and the leakage current is also decreased in the off-state. Further, although the channel length is increased, the decrease in the ON current of the thin film transistor is prevented by forming the auxiliary junction region between the source and drain regions.

DETAILED DESCRIPTION OF THE PREFERRED EMBODIMENT

Hereinafter, a detailed description of the preferred embodiment is made with reference to the attached drawings.

FIGS. 2A to 2E are cross-sectional views showing a method for manufacturing a POLY-TFT according to the embodiment of the present invention.

Figure 1:
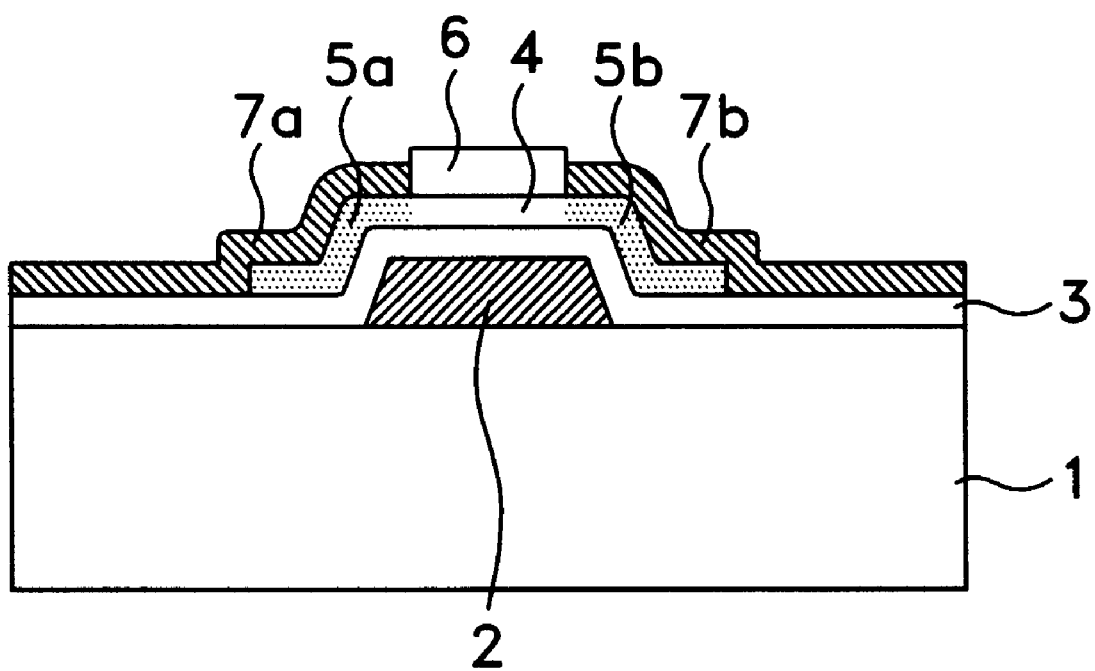
FIG. 1 is a cross-sectional view of a conventional POLY-TFT.
Figure 2A:
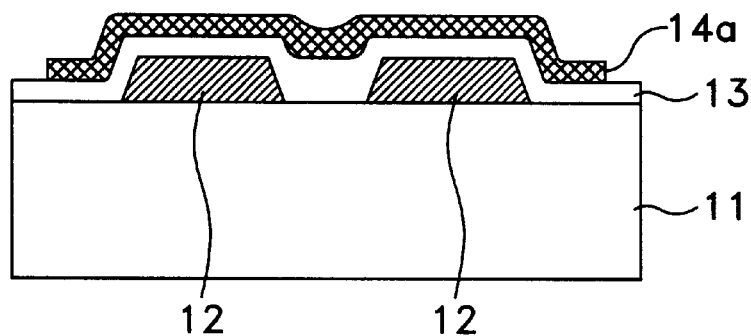
FIGS. 2A to 2E are cross-sectional views showing a method for manufacturing a POLY-TFT according to the embodiment of the presept invention.

Referring to FIG. 2A, a metal layer for gate electrode is deposited on a substrate 11 and a first resist pattern (not shown) for gate electrode is formed on the metal layer for gate electrode according to a known photolithography method. The metal layer for gate electrode is patterned by the first resist pattern thereby forming a gate electrode 12. The number of the gate electrode 12 is limited at least two to ten with a pixel (not shown). Widths of the respective gate electrode 12 is set in the reverse proportional to the number of the gate electrode 12 and the respective gate electrodes 12 are spaced each other by a regular distance, preferably in the range of 1 to 5 µm. In the present embodiment, two gate electrodes 12 are formed and preferably both side walls of the gate electrodes 12 are shaped of tapers.

A gate insulating layer 13 is coated on the substrate 11 where the gate electrode 12 is formed. An amorphous silicon layer for channel layer is formed on the gate insulating layer 13 and a second resist pattern(not shown) is formed on the amorphous silicon layer according to a known photolithography method. The amorphous silicon layer is patterned by the second resist pattern thereby forming an amorphous channel layer 14a. The amorphous channel layer 14a is formed to cover the entire gate electrodes.

Figure 2B:
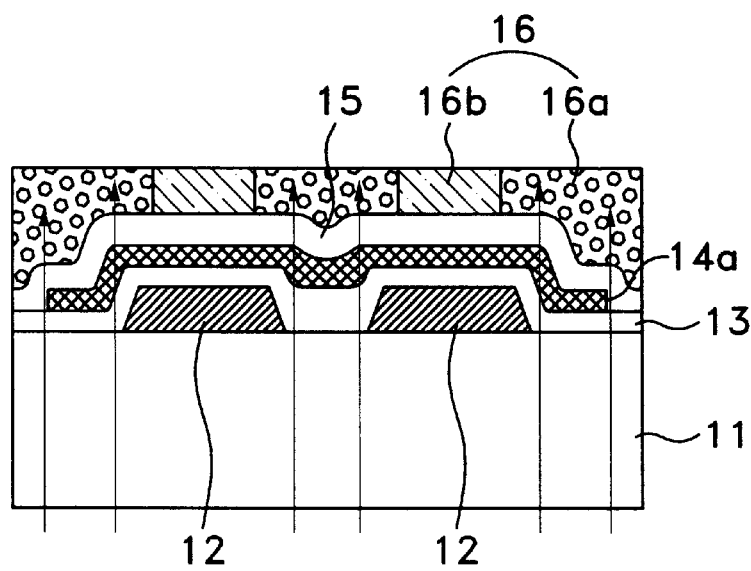

As shown in FIG. 2B, an insulating layer 15 for ion stopper is deposited on the amorphous channel layer 14a and the gate insulating layer 13. Next, a photoresist film 16 is coated on the insulating layer 15 for ion stopper. The light is radiated from back side of the substrate 11, the photoresist film 16 is partially exposed. Therefore, the photoresist film 16b on the gate electrode 12 is not exposed and the photoresist film 16a corresponding to both sides of the gate electrode 12 is exposed.

Afterward, the photoresist film 16a is removed according to a developing step thereby forming a third resist pattern (not shown) for ion-stopper. Herein, the third resist pattern requires no additional reticle, but uses the gate electrode 12 as a mask. Next, the insulating layer for ion stopper is patterned according to the third resist pattern thereby forming an ion stopper 15. The third resist pattern is removed by a known method.

Figure 2C:
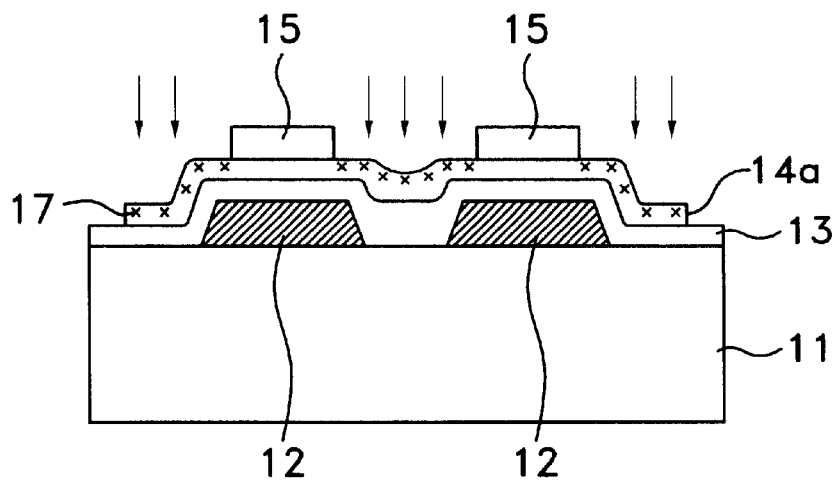

And then, as shown in FIG. 2C, source and drain impurities 17 are ion-implanted in the amorphous channel layer 14a of both sides of the ion stopper 15. Herein, the impurities 17 are not implanted to the channel layer 14a formed in the lower portion of the ion stopper 15. The impurities 17 are implanted at a dose of $10^{11}$~$10^{19}$ ions/cm$^3$ regardless of the types of impurities, i.e. N type or P type.

Figure 2D:
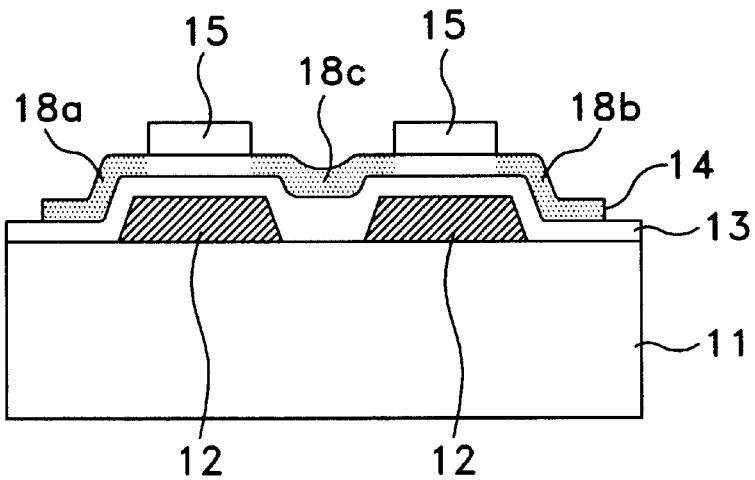
Figure 2E:
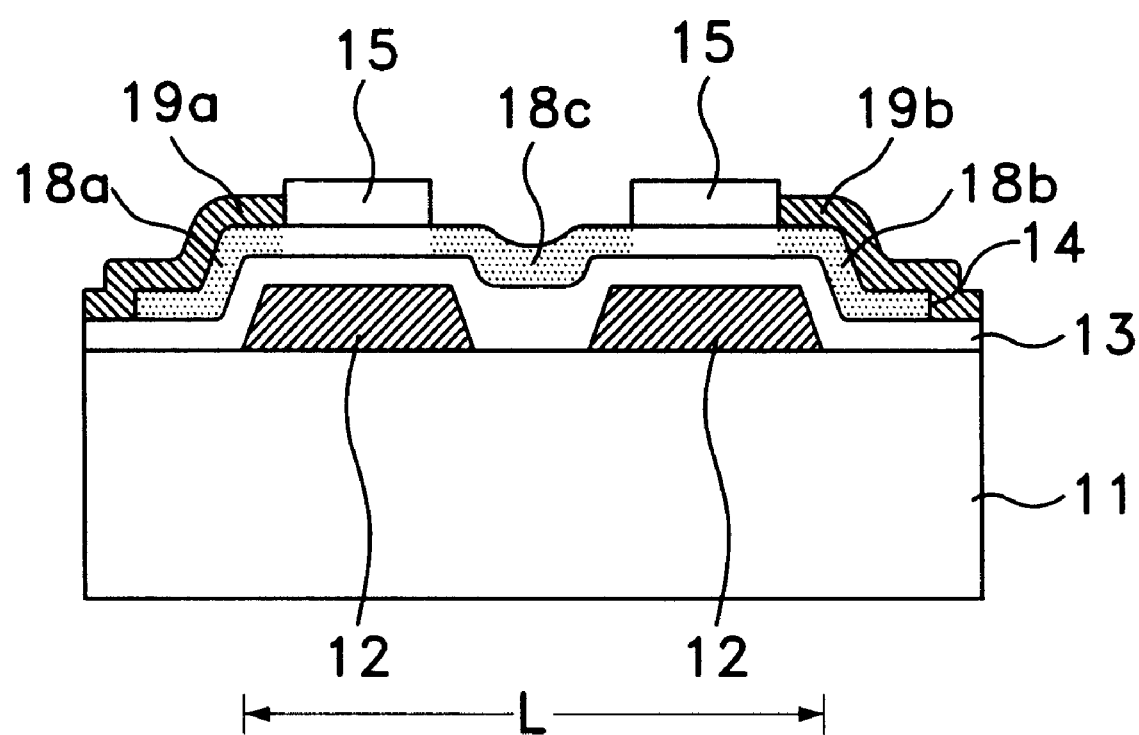

As shown in FIG. 2D, the amorphous channel layer 14a is annealed by exposing a laser beam so that the implanted impurities 17 in the amorphous channel layer 14a are activated and the amorphous channel layer 14a becomes polysilicon. Herein, the laser beam can be emitted from the front side, from back side or from both front and back sides. According to the laser annealing process, the amorphous channel layer 14a becomes poly-channel layer 14 and the impurities 17 are activated thereby forming junction regions 18a, 18b, 18c. Herein, the substantial source and drain regions are the junction regions 18a, 18b in the outer positions. Further, the junction regions 18c between the gate electrodes 12 become an auxiliary junction region.

Afterward, a metal layer for electrode is deposited on the resultant of the substrate 11. Next, a fourth resist pattern(not shown) for electrode is formed on the metal layer according to a known method. The metal layer is patterned to be contacted with the substantial source and drain regions 18a, 18b in the form of the fourth resist pattern thereby forming a source electrode 19a and a drain electrode 19b. Herein, no electrode is formed in the auxiliary junction region 18c. Afterward, the fourth resist pattern is removed according to a known method. The POLY-TFT is accomplished.

Operation of the POLY-TFT as constituted above.

At least one gate electrode 12 is formed in a pixel, therefore the distance L between the source and drain regions 18a, 18b is greater than that of the conventional thin film transistor. The drain electric field is decreased according to the increase in the distance L. Accordingly, the leakage current of high drain electric field is decreased.

Furthermore, the auxiliary junction region 18c formed between the source and drain regions 18a, 18b prevents the decrease of on current in the on-state. That is to say, the ON current is not decreased, even though the distance between gate electrodes i.e. the channel length L is enlarged since there is formed the auxiliary junction region 18c.

While the present invention has been described in its embodiment, however, it is not limited in the embodiment. Two gate electrodes are formed in the present embodiment, it is also available that two to ten gate electrodes can be used.

According to the present invention, since at least two gate electrodes are formed in the POLY-TFT, the channel length is increased. Therefore, the drain electric field is decreased and the leakage current is also decreased in the off-state. Further, although the channel length is increased, the decrease in the ON current of the thin film transistor is prevented by forming the auxiliary junction region between the source and drain regions.

Additionally, since the present invention employs the bottom gate method, no mask for ion-stopper is required and the manufacturing process is simplified.

Various other modifications will be apparent to and can be readily made by those skilled in the art without departing from the scope and spirit of the present invention.

What is claimed is:

1. A method for making a polysilicon thin film transistor, comprising the steps of:

forming a plurality of gate electrodes on a substrate;

forming a gate insulating layer on the substrate so as to cover the gate electrodes;

forming a channel layer by depositing an amorphous silicon layer on the gate insulating layer and by patterning the amorphous silicon layer, the channel layer covering the gate electrodes;

forming ion stopper on selected portions of the channel layer corresponding to the gate electrodes;

implanting impurities into portions of the channel layer located on opposing sides of the ion stoppers so as to form a plurality of impurity regions in the channel layer, the plurality of impurity regions having outermost regions at ends thereof and an intermediate region between an adjacent pair of the gate electrodes;

transforming the channel layer into a polysilicon layer; and forming source and drain electrodes, each of which is in contact with a corresponding one of the outermost regions, wherein the outermost regions are source and drain regions, and the intermediate region is an auxiliary junction region for compensating an ON current.

2. The method of claim 1, wherein the transforming step includes the step of exposing the channel layer to a laser beam so as to transform the channel layer into the polysilicon layer.

3. The method of claim 2, wherein the laser beam is emitted from a front side of the substrate.

4. The method of claim 2, wherein the laser beam is emitted from a back side of the substrate.

5. The method of claim 2, wherein the laser beam is emitted from front and back sides of the substrate.

6. The method of claim 1, wherein the impurities are implanted at a dose of $10^{11}$~$10^{19}$ ions/cm$^3$ regardless of the types of impurities.

7. The method of claim 1, wherein the ion stoppers are formed by using a back-side exposing method.

8. The method of claim 7, wherein the impurities contained in the plurality of impurity regions are activated during the performance of the transforming step.

9. The method of claim 1, wherein the number of the gate electrodes ranges from 2 to 10.

* * * * *